(12) United States Patent
Tornblad et al.

(10) Patent No.: US 6,989,567 B2
(45) Date of Patent: Jan. 24, 2006

(54) LDMOS TRANSISTOR

(75) Inventors: Olof Tornblad, Los Gatos, CA (US); Gordon Ma, Phoenix, AZ (US)

(73) Assignee: Infineon Technologies North America Corp., San Jose, CA (US)

( * ) Notice: Subject to any disclaimer, the term of this patent is extended or adjusted under 35 U.S.C. 154(b) by 59 days.

(21) Appl. No.: 10/678,837

(22) Filed: Oct. 3, 2003

(65) Prior Publication Data

US 2005/0073003 A1 Apr. 7, 2005

(51) Int. Cl.
- H01L 29/76 (2006.01)
- H01L 29/94 (2006.01)
- H01L 31/062 (2006.01)
- H01L 31/113 (2006.01)
- H01L 31/119 (2006.01)

(52) U.S. Cl. .............. 257/343; 257/335; 257/336; 257/337; 257/339; 257/340; 257/344; 257/408; 257/548; 257/611

(58) Field of Classification Search ......... 257/335–337, 257/339–340, 343–344, 408, 548, 611
See application file for complete search history.

(56) References Cited

U.S. PATENT DOCUMENTS

| | | | | |
|---|---|---|---|---|
| 4,672,419 A | * | 6/1987 | McDavid | 257/382 |
| 4,746,624 A | * | 5/1988 | Cham et al. | 438/305 |
| 4,811,075 A |   | 3/1989 | Eklund | 357/46 |
| 5,132,753 A |   | 7/1992 | Chang et al. | 257/655 |
| 5,155,563 A |   | 10/1992 | Davies et al. | 357/23.4 |
| 5,313,082 A |   | 5/1994 | Eklund | 257/262 |
| 5,349,225 A | * | 9/1994 | Redwine et al. | 257/336 |
| 5,422,506 A | * | 6/1995 | Zamapian | 257/344 |
| 5,440,165 A | * | 8/1995 | Mitsunaga et al. | 257/408 |
| 5,585,294 A | * | 12/1996 | Smayling et al. | 438/307 |
| 6,078,086 A | * | 6/2000 | Park | 257/386 |
| 6,168,983 B1 |   | 1/2001 | Rumennik et al. | 438/188 |
| 6,191,462 B1 | * | 2/2001 | Chen-Hua | 257/408 |
| 6,242,787 B1 | * | 6/2001 | Nakayama et al. | 257/493 |
| 6,495,885 B1 | * | 12/2002 | Ahmad et al. | 257/336 |
| 6,563,171 B2 |   | 5/2003 | Disney | 257/342 |
| 6,613,622 B1 |   | 9/2003 | Nair et al. | 438/188 |
| 6,762,456 B1 | * | 7/2004 | D'Anna et al. | 257/335 |
| 2004/0108544 A1 | * | 6/2004 | Hossain et al. | 257/328 |
| 2004/0124462 A1 | * | 7/2004 | D'Anna et al. | 257/335 |
| 2004/0173846 A1 | * | 9/2004 | Hergenrother et al. | 257/335 |

OTHER PUBLICATIONS

J.A. Appels and H.M.J. Vaes, "High voltage thin layer devices (RESURF devices)", IEDM technical digest, pp. 238–241, 1979.

H.M.J. Vaes and J.A. Appels, "High voltage high current lateral devices", IEDM technical digest, pp. 87–90, 1980.

T. Fujihira, "Theory of Semiconductor Superjunction Devices", Jpn. J. Appl. Phys., vol. 36, pp. 6254–6262, 1997.

(Continued)

*Primary Examiner*—Amir Zarabian
*Assistant Examiner*—Ida M. Soward
(74) *Attorney, Agent, or Firm*—Baker Botts L.L.P.

(57) ABSTRACT

A semiconductor transistor structure includes a substrate having an epitaxial layer, a source region extending from the surface of the epitaxial layer, a drain region within the epitaxial layer, a channel located between the drain and source regions, and a gate arranged above the channel. The drain region includes a first region for establishing a contact with an electrode, a second region being less doped than the first region being buried within the epitaxial layer and extending from the first region horizontally in direction towards the gate, a third region less doped than the second region and extending vertically from the surface of the epitaxial layer and horizontally from the second region until under the gate, a top layer extending from the surface of the epitaxial layer to the second region, and a bottom layer extending from the second region into the epitaxial layer.

32 Claims, 6 Drawing Sheets

OTHER PUBLICATIONS

G. Deboy, M. Marz, J.-P. Stengl, H. Strack, J. Tihanyi and H. Weber, "A new generation of high voltage MOSFETs breaks the limit line of silicon", IEDM technical digest, pp. 683–685, 1998.

A. Ludikhuize, "A review of RESURF technology", Proc. of ISPSD, p. 11, 2000.

J. Cai, C. Ren, N. Balasubramanian and J.K.O. Sin, A novel high performance stacked LDD RF LDMOSFET, IEEE Electron Device Lett., vol. 22, No. 5, pp. 236–238, 2001.

J.G. Mena and C.A.T. Salama, "High voltage multiple-resistivity Drift-Region LDMOS", Solid State Electronics, vol. 29, No. 6, pp. 647–656, 1986.

M.D. Pocha and R.W. Dutton, "A computer–aided design model for High–Voltage Double Diffused MOS (DMOS) Transistors", IEEE Journal of Solid–State Circuits, vol. SC–11, No. 5, 1976.

I. Yoshia, M. Katsueda, S. Ohtaka, Y. Maruyama and T. Okabe; "High Efficient 1.5 GHz Si Power MOSFET for Digital Cellular Front End"; Proceedings of International Symposium on Power Semiconductor Devices & ICs; Tokyo, pp. 156–157, 1992.

Dragon et al., "A Silicon MOS Process for Integrated RF Power Amplifiers," IEEE MTT–S Digest, pp. 257–260.

\* cited by examiner

LDMOS TRANSISTOR

FIELD OF THE INVENTION

The present application relates to an LDMOS transistor structure.

BACKGROUND OF THE INVENTION

LDMOS transistor structures are widely used as semiconductor devices for many types of transistor applications such as high voltage MOS field effect transistors. An LDMOS transistor comprises a lightly doped drain region to enhance the breakdown voltage. LDMOS transistors comprise, thus, a higher on resistance due to the lightly doped region within the drain. The interrelation between breakdown voltage and on-resistance relates to the maximum electric field defined by the pn-junction which needs to stay below the critical electric field for the semiconductor to avoid breakdown. This maximum electrical field is defined by the doping level of, for example, the $n^-$ doped drain in a nmos field effect transistor. Furthermore, in applications in which the transistor is most of the time driven to conduct, the long on-state can lead to substantial hot carrier injection resulting in DC parametric drift. This is a very common issue with LDMOS transistor structures.

Figure 1:
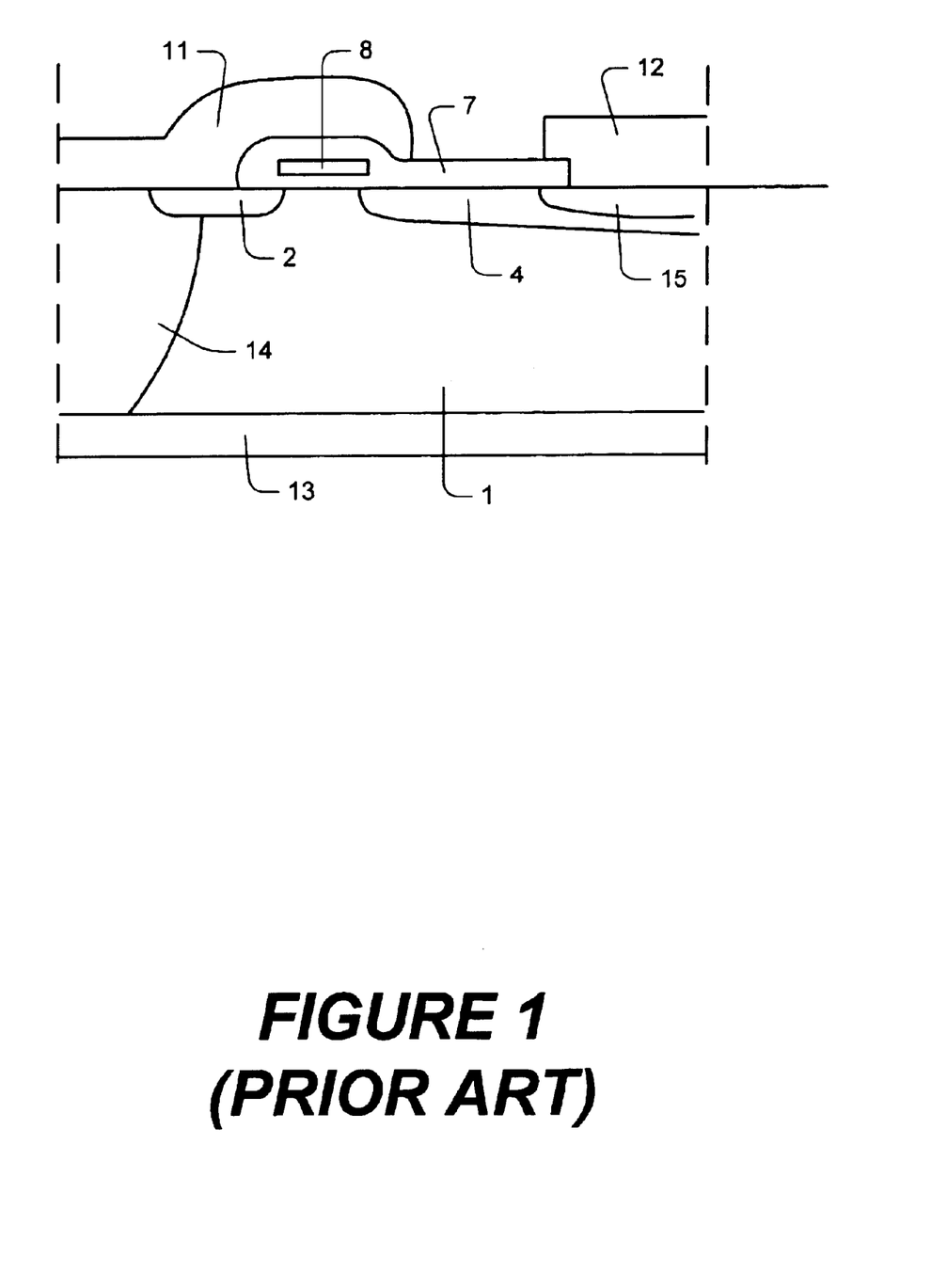
FIG. 1 is a partial sectional view of a semiconductor wafer including a transistor structure according to the prior art.

FIG. 1 shows a typical power LDMOS transistor. A wafer comprises, for example, a p substrate 13 on top of which an epitaxial layer 1 is deposited. This layer 1 includes n conductivity type areas 2 and 4, 15 implanted into the surface to provide a source and drain region, respectively. The epitaxial layer 1 is usually covered with an insulating dielectric layer 7 such as silicon oxide in which a polysilicon gate 8 is arranged to cover the channel between the drain 4, 15 and source 2. The drain in this exemplary LDMOS transistor comprises a first region 15 which is $n^+$ doped and which comprises a connection to a drain electrode 12 arranged above that region 15 through a window in the insulator layer 7. This $n^{30}$ region is surrounded by a lighter doped $n^-$ region 4 that extends until under gate 8 to define a channel between the source and the drain region. On the source side of this transistor a $p^{30}$ doped sinker 14 is provided which extends from the surface of the epitaxial layer 1 down to the substrate to provide for a backside source contact. Contact 11 connects the source region 2 with the sinker 14.

Figure 2:
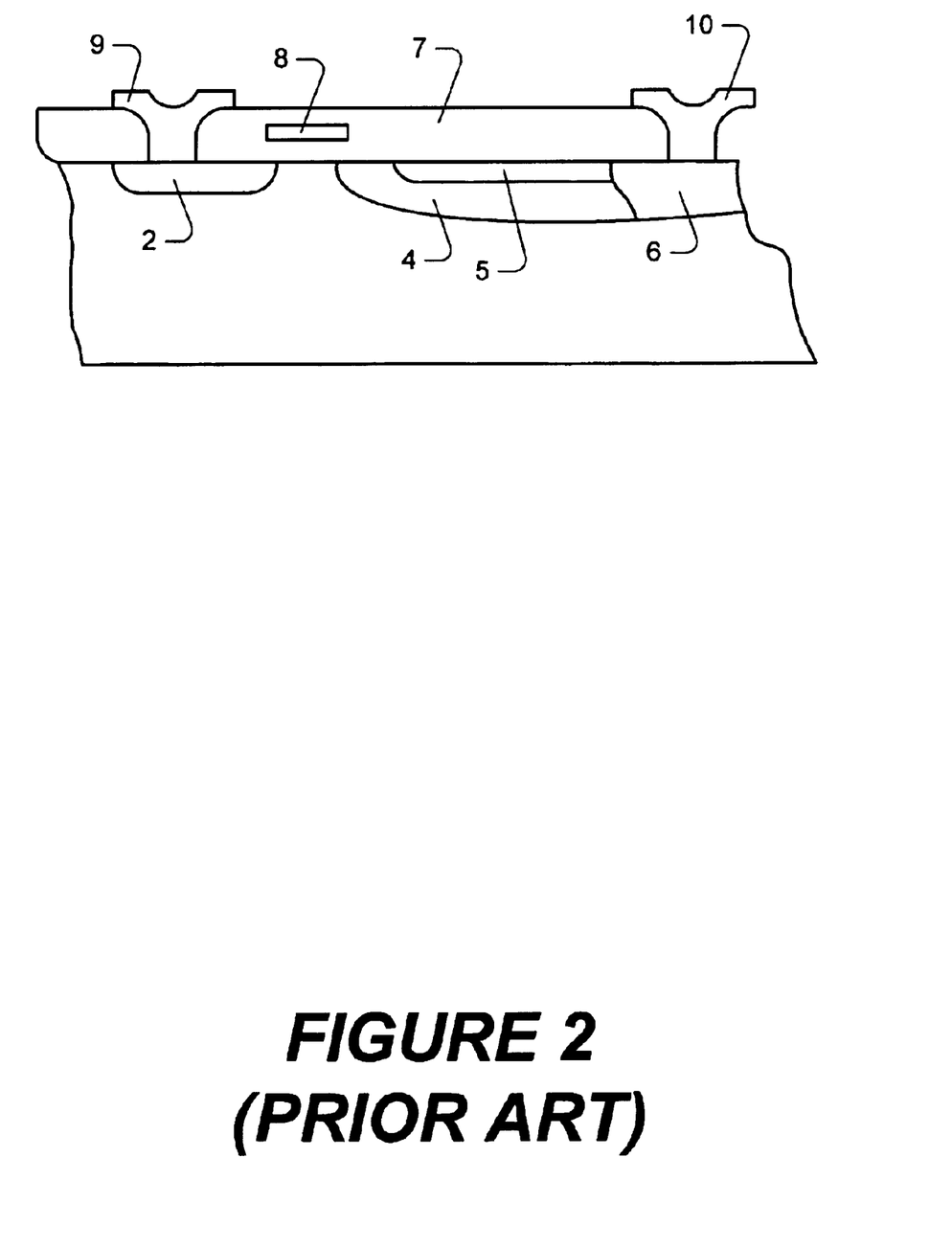
FIG. 2 is a partial sectional view of a semiconductor wafer including a transistor structure as proposed for use for instance in smart power applications according to the prior art.

FIG. 2 shows an LDMOS transistor as proposed for use, for example, in smart power applications. A wafer comprises, for example, a p substrate 1 which includes n conductivity type areas 2 and 4, 6 diffused or implanted into the surface to provide a source and drain region, respectively. The substrate 1 is usually covered with an insulator layer 7 such as silicon oxide in which a polysilicium gate 8 is arranged to cover the channel between the drain 4, 6 and source 2. Source 2 is coupled with a source electrode 9 through a window in the insulator layer 7. The drain in this exemplary LDMOS transistor comprises a first region 6 which is $n^{30}$ doped and which comprises a connection to a drain electrode 10 arranged above that region 6 through a window in the insulator layer 7. From this $n^{30}$ region extends a lighter doped n region 4 to the left of region 6 until under gate 8 to define a conducting path to the gate channel region. To extend the field effect pinch-off depletion zones from above, a layer of p material 5 is implanted in the upper part of the extended region 4 of the drain and reaching the tap surface of the epitaxial layer.

SUMMARY OF THE INVENTION

According to the present application, a new transistor structure is introduced. For example, a semiconductor transistor structure comprises a substrate having an epitaxial layer of a first conductivity type, a source region extending from the surface of the epitaxial layer of a second conductivity type, a drain region within the epitaxial layer of a second conductivity type, a channel located between the drain and source regions, and a gate arranged above the channel. The drain region may comprise a first region of the second conductivity type for establishing a contact with an electrode, a second region of the second conductivity type being less doped than the first region being buried within the epitaxial layer and extending from the first region horizontally in direction towards the gate, a third region being of the second conductivity type less doped than the second region and extending vertically from the surface of the epitaxial layer and horizontally from the second region until under the gate, a top layer of the first conductivity type extending from the surface of the epitaxial layer to the second region, and a bottom layer of the first conductivity type extending from the second region into the epitaxial layer.

The third region may comprise a first sub-region of the second conductivity type extending from the second region horizontally towards the gate and a second sub-region of the second conductivity type extending vertically from the surface of the epitaxial layer and horizontally from the first sub-region until under the gate. The first sub-region may be less doped than said second region and the second sub-region being less doped than the first sub-region. Alternatively, the first sub-region can be less doped than that second region and the first and the second sub-region may overlap and the first sub-region can be partially less doped than the second sub-region. The semiconductor structure may further comprise a voltage termination of the second conductivity type extending from the electrode deeper into the epitaxial layer than the first region. The semiconductor structure may also further comprise a sinker structure of the first conductivity type extending from the source region to the bottom of the epitaxial layer. The substrate can be heavily doped. The second region can have an approximate horizontal length of 1–3 microns. The first conductivity type can be a p-type and the second conductivity type can be an n-type or vice versa.

Another embodiment is a semiconductor transistor structure comprising a substrate having an epitaxial layer of a first conductivity type, a source region extending from the surface of the epitaxial layer of a second conductivity type, a drain region within the epitaxial layer of a second conductivity type, a channel located between the drain and source regions, and a gate arranged above the channel. The drain region may comprise a first region of the second conductivity type for establishing a contact with an electrode, a second region of the second conductivity type being less doped than the first region being buried within the epitaxial layer and extending from the first region horizontally in direction towards the gate, a third region of the second conductivity type being less doped than that second region and extending from the second region horizontally towards the gate, a fourth region of the second conductivity type being less doped than the third region and extending vertically from the surface of the epitaxial layer and horizontally from the third region until under the gate, a top layer of the first conductivity type extending from the surface of the epitaxial layer to the second region, and a bottom layer of the first conductivity type extending from the second region into the epitaxial layer.

This semiconductor structure may further comprise a voltage termination of the second conductivity type extending from the electrode deeper into the epitaxial layer than the first region. The semiconductor structure may also further comprise a sinker structure of the first conductivity type extending from the source region to the bottom of the epitaxial layer. The substrate can be heavily doped. The second region can have an approximate horizontal length of 1–3 microns. The first conductivity type can be a p-type and the second conductivity type can be an n-type or vice versa.

Yet another embodiment is a semiconductor transistor structure comprising a substrate having an epitaxial layer of a first conductivity type, a source region extending from the surface of the epitaxial layer of a second conductivity type, a drain region within the epitaxial layer of a second conductivity type, a channel located between the drain and source regions, and a gate arranged above the channel. The drain region may comprises a first region of the second conductivity type for establishing a contact with an electrode, a second region of the second conductivity type being less doped than the first region being at least partially buried within the epitaxial layer and extending from the first region horizontally until under the gate, a top layer of the first conductivity type extending from the surface of the epitaxial layer to the second region, and a bottom layer of the first conductivity type extending from the second region into the epitaxial layer.

This semiconductor structure may further comprise a voltage termination of the second conductivity type located on the side of the drain region opposite the side facing the gate and extending from the surface of the epitaxial layer. The semiconductor structure may also further comprise a sinker structure of the first conductivity type extending from the source region to the bottom of the epitaxial layer. The substrate may be heavily doped. The second region can have an approximate horizontal length of 1–3 microns. The first conductivity type can be a p-type and the second conductivity type can be an n-type or vice versa.

Yet another embodiment is a semiconductor transistor structure comprising a substrate having an epitaxial layer of a first conductivity type, a source region extending from the surface of the epitaxial layer of a second conductivity type, a drain region within the epitaxial layer of a second conductivity type, a channel located between the drain and source regions, and a gate arranged above the channel. The drain region may comprise a first region of the second conductivity type for establishing a contact with an electrode, a second region of the second conductivity type being less doped than the first region being buried within the epitaxial layer and extending from the first region horizontally in direction towards the gate, a third region of the second conductivity type being less doped than that second region and extending from the second region horizontally towards the gate, a fourth region of the second conductivity type extending vertically from the surface of the epitaxial layer and horizontally from the third region until under the gate, wherein the third region and the fourth region overlap and the overlap is higher doped than the fourth region, a top layer of the first conductivity type extending from the surface of the epitaxial layer to the second region, and a bottom layer of the first conductivity type extending from the second region into the epitaxial layer.

This semiconductor structure may further comprise a voltage termination of the second conductivity type extending from the electrode deeper into the epitaxial layer than the first region. The semiconductor structure may also further comprising a sinker structure of the first conductivity type extending from the source region to the bottom of the epitaxial layer. The substrate can be heavily doped. The second region can have an approximate horizontal length of 1–3 microns. The first conductivity type can be a p-type and the second conductivity type can be an n-type or vice versa. The third region can be partially less doped than the fourth region.

Other technical advantages of the present disclosure will be readily apparent to one skilled in the art from the following figures, descriptions, and claims. Various embodiments of the present application obtain only a subset of the advantages set forth. No one advantage is critical to the embodiments.

BRIEF DESCRIPTION OF THE DRAWINGS

A more complete understanding of the present disclosure and advantages thereof may be acquired by referring to the following description taken in conjunction with the accompanying drawings, in which like reference numbers indicate like features, and wherein.

DETAILED DESCRIPTION OF THE PREFERRED EMBODIMENTS

Figure 3:
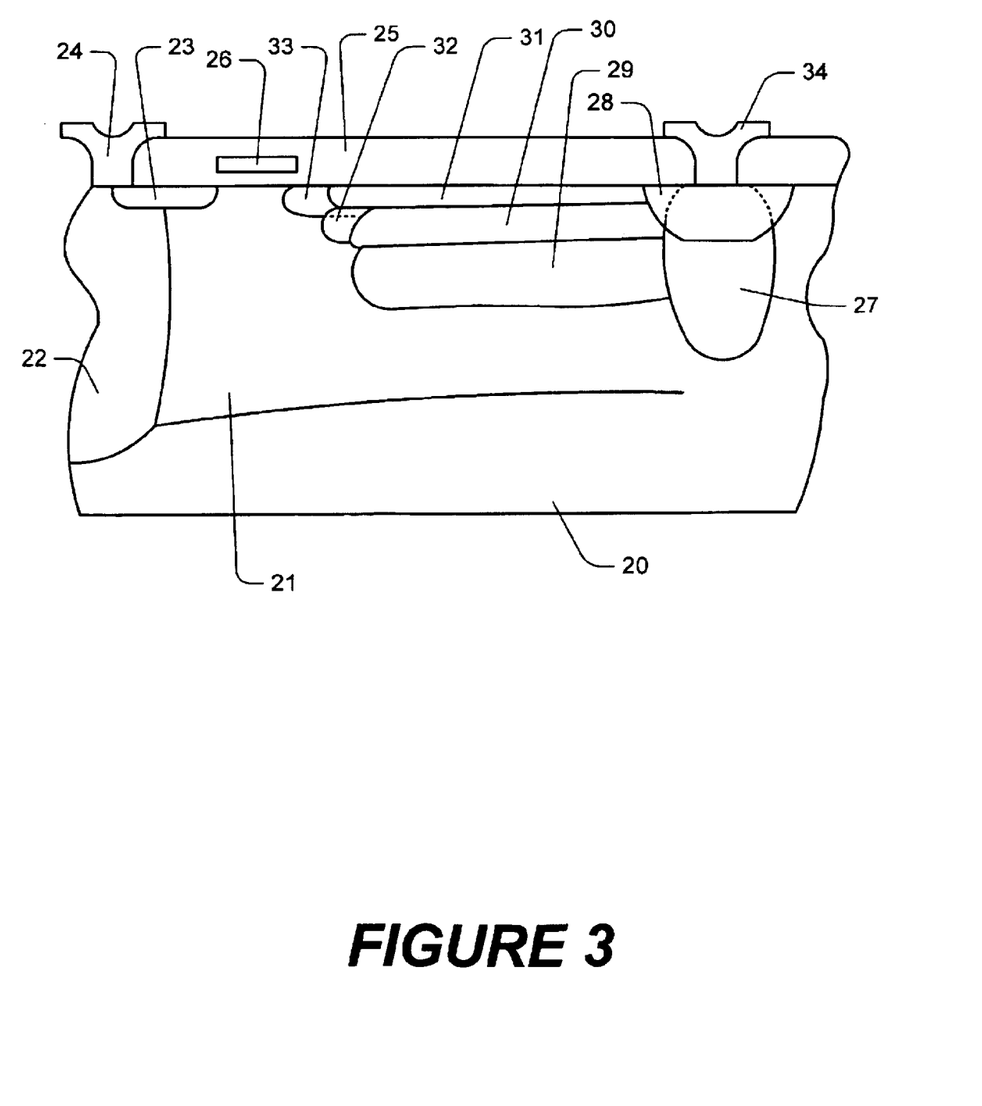
FIG. 3 is a partial sectional view of a semiconductor wafer including a transistor structure according to one embodiment of the present invention.

Turning to the drawings, exemplary embodiments of the present application will now be described. FIG. 3 depicts an improved transistor structure according to an exemplary embodiment of the present invention. On top of a p$^+$ substrate 20, a p epitaxial layer 21 is arranged. For example, the substrate can be doped heavily with $10^{19}/cm^3$ and the epitaxial layer can be less doped with $10^{15}/cm^3$. Along the top surface of the epitaxial layer 21, a source region 23 extends laterally from the source side of gate 26 to an electrically floating electrode or metal interconnection 24. The electrically floating contact 24 connects the oppositely doped source region 23 and a p$^+$sinker region 22. The p$^+$ sinker region 22 reaches from the source region 23 to the p$^+$ substrate 20. A source metal contact (not shown) is placed along the entire backside of the wafer. Again an insulator layer 25 is placed on the top surface of the epitaxial layer 21 and comprises a gate 26 and windows for respective source and drain electrodes 24, 34. On top of the insulator layer 25, usually a passivation layer (not shown) is deposited.

The improved transistor structure comprises a drain region with a multiple layer arrangement as shown in FIG. 3. In this exemplary embodiment, a graded superjunction is created by this multilayer structure. A first relatively short resulting region 33 being n$^-$ doped extends from under gate 26 to the drain contact electrode 34. Between this short n$^-$ doped region 33 and the drain contact electrode 34 follows a second n$^-$ doped region 32 which extends deeper into the epitaxial layer 21. In one embodiment, a graded doping concentration from region 33 to region 28 with increasing doping concentration is obtained. However, other embodiments are possible. In one preferred embodiment, the maximum doping concentration of this region 32 is not necessarily higher than the maximum doping concentration for region 33. The implant dose of region 32 could be less than that of region 33. However, the region 32 implant overlaps with the region 33 implant and is partially compensated by the region 31 implant. The doping overlap between regions 32 and 33 results in a higher doping concentration in the part of the overlap region of 32 as compared to the region 33 and a lower doping concentration in the remaining part of region 32. This is because the doping concentration of region 33 drops with vertical distance from the top surface. Region 32, in this particular embodiment has, thus, two functions. The overlapping part of region 32 is used to carry the current whereas the lesser doped part of that region is used to relax the electrical field. Thus, different graded junctions from region 33 to region 30 can be formed which still are within the scope of the present application.

Furthermore in this embodiment, region 32 does not reach the surface of the epitaxial layer 21. However, depending on the doping concentration, this layer could also reach to the top surface of epitaxial layer 21. Between the second n⁻ doped region 32 and the drain contact electrode 34 extends a relatively long (appr. 1–3 microns) n doped conducting stripe 30 which couples the n⁻ doped region 32 with a heavily doped n⁺ region 28 that extends from drain electrode 34 into the epitaxial layer 21. Thus, the drain starts with a heavily doped n⁺ region 28 from the electrode 34 that gradually ends in a lightly doped n⁻ region 33 under the gate 26. The n doped conducting stripe may have an approximate horizontal length of 1–3 microns and is basically shielded by an implanted p doped top layer 31 and bottom layer 29 that extend from the heavily n⁺ doped region 28 horizontally towards gate 26 for substantially the length of the n doped conducting layer 30. In the center of the drain region starting under the drain electrode 34 a n⁺ doped termination region 27 is implanted which reaches from the surface deep into the epitaxial layer 21. Region 28 is higher doped than region 27. Also, region 27 is higher doped than region 29. This is necessary to avoid breakdown between the drain contact 34 and region 29.

The lowly doped n⁻ region 33 close to gate 26 keeps the electric field low to suppress hot carrier injection into the gate and also to avoid early breakdown of the structure. Furthermore, this region 33 keeps the feedback capacitance Cdg between the gate and the drain low. The second or intermediate n⁻ doped region 32 can be provided for trade-off between on-resistance, breakdown of the transistor structure, hot carrier injection, and feedback capacitance Cdg. The intermediate n⁻ doped implant region 32 can be produced, for example, through a 0 degree off-set implant mask or a tilted angle self-aligned implant mask. Such a structure with vertically alternating layers 31, 30, 29 and the graded regions 33, 32, 28 and 27 forms a new combination of superjunctions and graded junctions which are used to overcome the above mentioned trade-off. The advantage with this concept lies in the fact that the highly doped conducting layer is depleted from both top and bottom, thus, also enabling a high breakdown voltage despite the higher doping concentration of the n conducting stripe. By the introduction of laterally graded junctions 33, 32, and 29 close to the gate 26, an optimization of several critical parameters affecting radio frequency performance is made possible. In addition to optimization of on-resistance and breakdown voltage, the graded junctions keep the electric field low at the gate oxide to suppress hot carrier injection (low drift), which as mentioned above is an important issue for LDMOS transistors. Moreover, the critical feedback capacitance Cdg can be kept at a low value. On the right side, a deep high energy implant 27 prevents breakdown to occur between the drain contact 34 and region 29.

Figure 4:
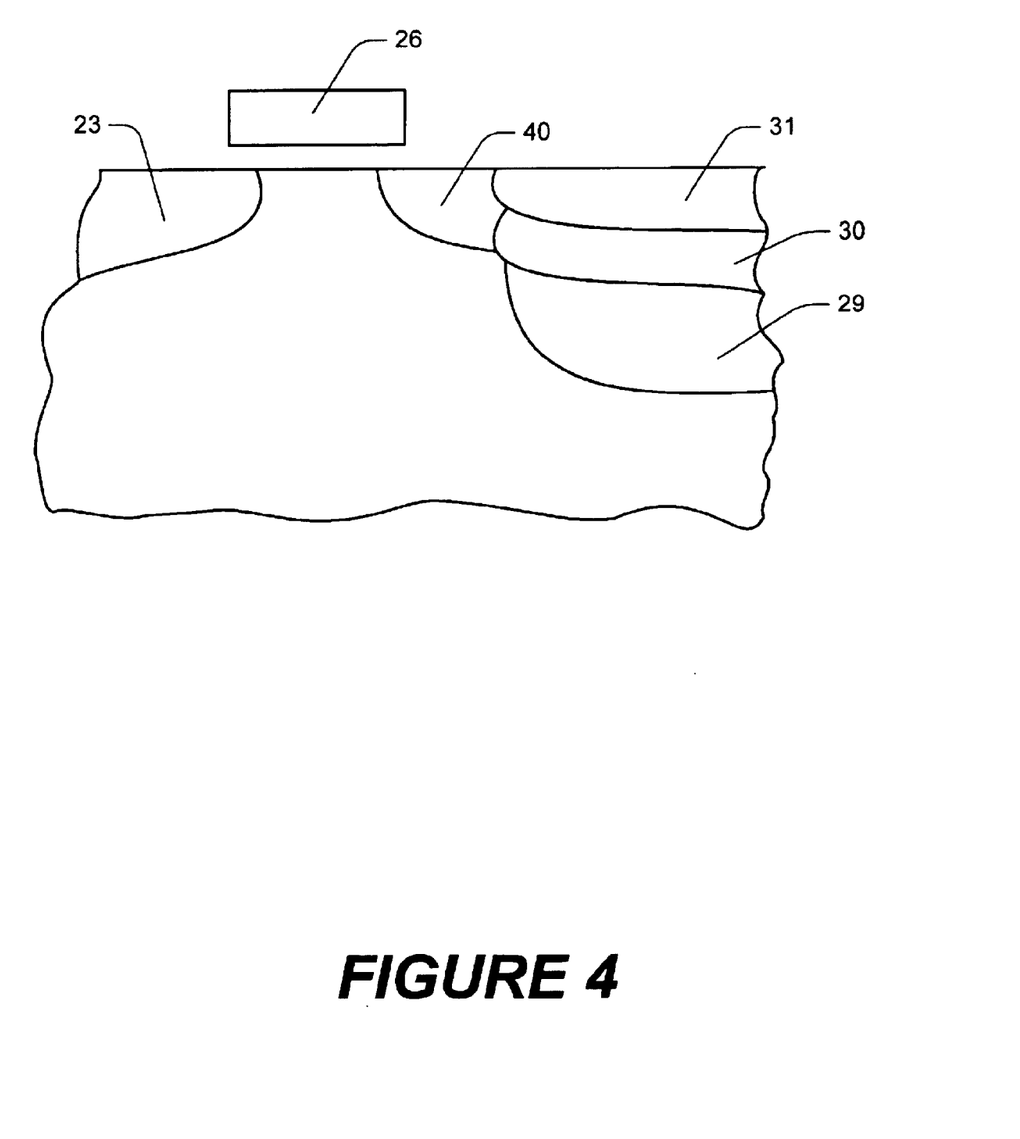
FIG. 4 is a partial sectional view of a semiconductor wafer including a transistor structure according to another embodiment of the present invention.

All regions can be created by ion implantation. The n conducting stripe can be created as a buried layer and is being depleted from the top and the bottom through layers 31 and 29, respectively. In particular implanted p layer 29 depletes the n conducting stripe 30 from the bottom which makes it possible to increase the doping concentration of the n conducting stripe compared to a structure as shown in FIG. 2 where most of the depletion is induced from the top p layer. The top p layer 31 depletes the n conducting stripe from above in a similar way as the structure shown in FIG. 2. There is a lowly doped n⁻ region 33 close to the gate oxide 26 to keep the electric field low around this critical 'corner'. This suppresses hot carrier injection into the gate oxide 26, avoids early breakdown and keeps the feedback capacitance Cdg low. The intermediate doped n⁻ implanted region 32 serves as an overlapping region between the n⁻ region 33 and the n conducting stripe 30. The depth and doping concentration of this implant is used to optimize the trade-off between on-resistance, breakdown voltage, hot carrier injection and feedback capacitance Cdg. However, also a single n⁻ region 40 can be used as shown in FIG. 4. FIG. 4 shows only the relevant section around the gate of another exemplary embodiment which is different from the embodiment shown in FIG. 3. Similar structures are designated with similar numerals.

Figure 5:
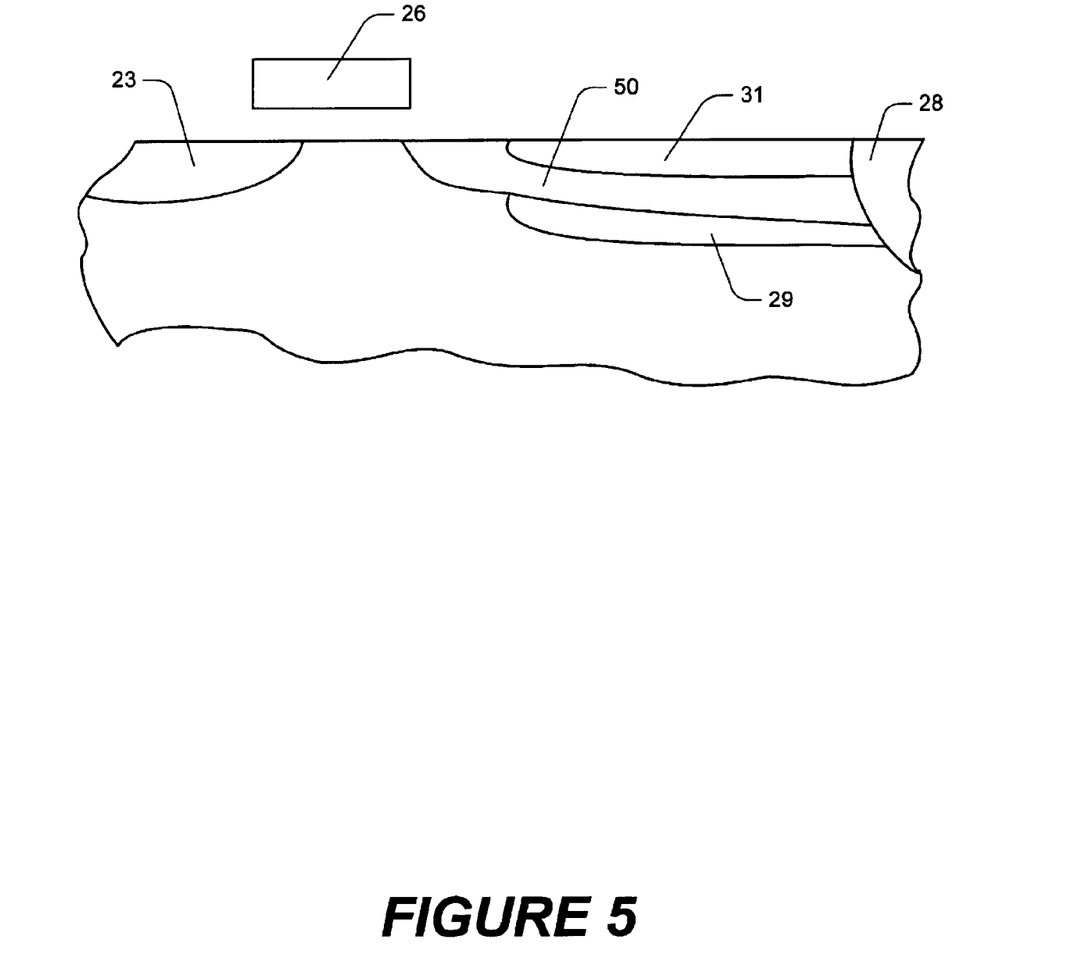
FIG. 5 is a partial sectional view of a semiconductor wafer including a transistor structure according to yet another embodiment of the present invention.

FIG. 5 shows yet another embodiment according to the present invention. Again, similar structures are designated with similar numerals. In this embodiment, regions 40 and region 30 as shown in FIG. 4 are merged into a single region 50. Thus, conducting stripe 50 is practically extended to reach under gate 26. Therefore, this embodiment only provides for two grade steps in forming a graded junction, namely, the higher doped region 28 and the lower doped region 50.

However, in all embodiments, there can be two implants under the drain contact electrode 34 as shown in FIG. 3. One shallow highly doped implant 28 for low contact resistance at the drain contact electrode 34 and another high energy implant 27 serving as voltage termination to prevent breakdown between the drain electrode 34 and the superjunction layer 29.

Figure 6:
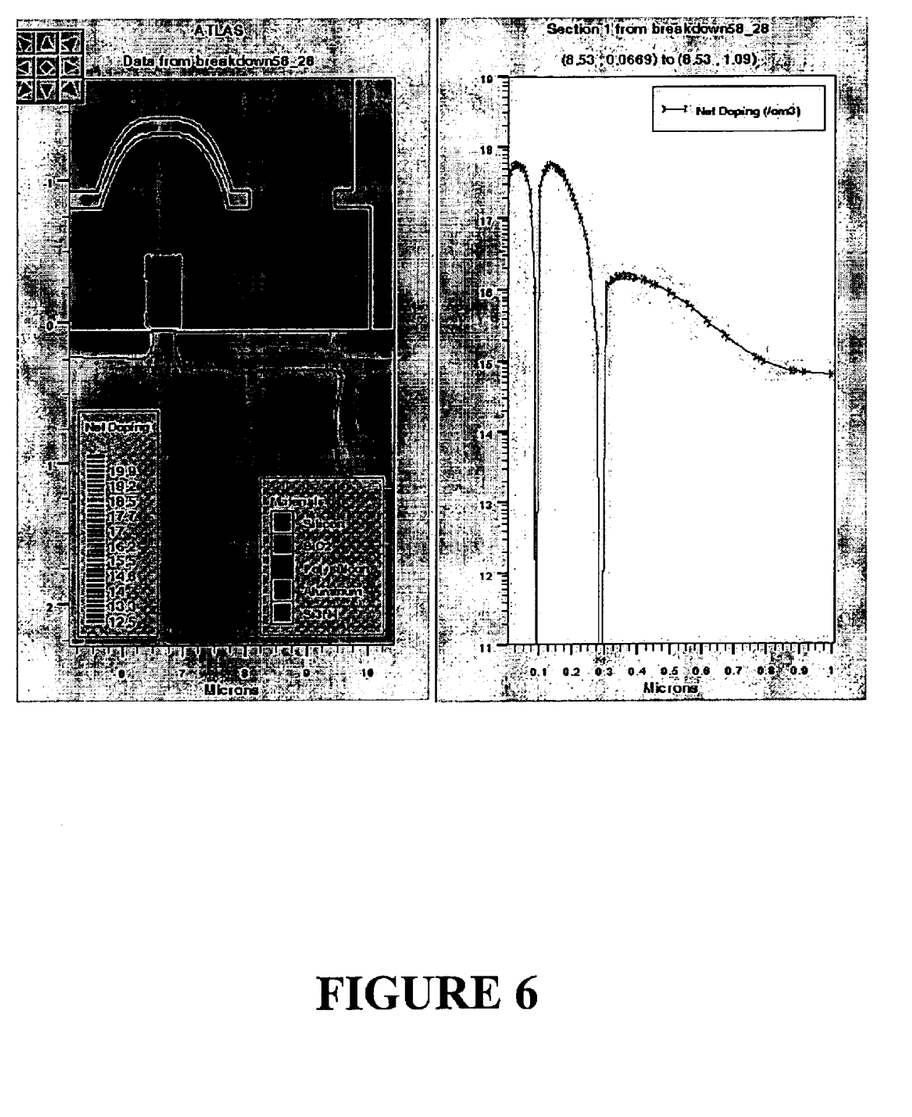
FIG. 6 shows graphs from a process simulation of a transistor structure according to the present invention.

FIG. 6 shows the implemented structure as a result from process simulation in a commercial tool. The right figure shows the net doping concentration along a cutline across the superjunction stack; lateral extension of the new drain engineering is approximately 3 μm. Thus, exemplary dimensions can be seen in this figure.

Although particular embodiments of the invention have been shown and described, the invention is not limited to the preferred embodiments and it will be apparent to those skilled in the art that various changes and modifications may be made without departing from the scope of the invention, which is defined only by the appended claims and their equivalents. For example, the substrate can be a p-type or an n-type substrate. Thus, source and drain region would be either of the n-type or the p-type, respectively.

What is claimed is:

1. A semiconductor transistor structure comprising:
   a substrate having an epitaxial layer of a first conductivity type;

a source region extending from the surface of the epitaxial layer of a second conductivity type;
a drain region within said epitaxial layer of a second conductivity type;
a channel located between said drain and source regions;
a gate arranged above said channel;
wherein said drain region comprises:
  a first region of said second conductivity type for establishing a contact with an electrode;
  a second region of said second conductivity type being less doped than said first region being buried within said epitaxial layer and extending from said first region horizontally in direction towards said gate;
  a third region being of said second conductivity type less doped than said second region and extending vertically from the surface of said epitaxial layer and horizontally from said second region until under said gate;
  a top layer of said first conductivity type extending from the surface of said epitaxial layer to said second region; and
  a bottom layer of said first conductivity type extending from said second region into said epitaxial layer.

2. The semiconductor structure as claimed in claim 1, wherein said third region comprises a first sub-region of said second conductivity type extending from said second region horizontally towards said gate and a second sub-region of said second conductivity type extending vertically from the surface of said epitaxial layer and horizontally from said first sub-region until under said gate.

3. The semiconductor structure as claimed in claim 2, wherein said first sub-region being less doped than said second region and said second sub-region being less doped than said first sub-region.

4. The semiconductor structure as claimed in claim 2, wherein said first sub-region being less doped than that second region and said first and said second sub-region overlap and said first sub-region is partially less doped than said second sub-region.

5. The semiconductor structure as claimed in claim 1, further comprising a voltage termination of the second conductivity type extending from the electrode deeper into the epitaxial layer than the first region.

6. The semiconductor structure as claimed in claim 1, further comprising a sinker structure of said first conductivity type extending from said source region to the bottom of said epitaxial layer.

7. The semiconductor structure as claimed in claim 6, wherein said substrate is heavily doped.

8. The semiconductor structure as claimed in claim 1, wherein said second region has an approximate horizontal length of 1–3 microns.

9. The semiconductor structure as claimed in claim 1, wherein the first conductivity type is a p-type and the second conductivity type is an n-type.

10. The semiconductor structure as claimed in claim 1, wherein the first conductivity type is a n-type and the second conductivity type is an p-type.

11. A semiconductor transistor structure comprising:
a substrate having an epitaxial layer of a first conductivity type;
a source region extending from the surface of the epitaxial layer of a second conductivity type;
a drain region within said epitaxial layer of a second conductivity type;
a channel located between said drain and source regions;
a gate arranged above said channel;
wherein said drain region comprises:
  a first region of said second conductivity type for establishing a contact with an electrode;
  a second region of said second conductivity type being less doped than said first region being buried within said epitaxial layer and extending from said first region horizontally in direction towards said gate;
  a third region of said second conductivity type being less doped than that second region and extending from said second region horizontally towards said gate;
  a fourth region of said second conductivity type being less doped than said third region and extending vertically from the surface of said epitaxial layer and horizontally from said third region until under said gate;
  a top layer of said first conductivity type extending from the surface of said epitaxial layer to said second region; and
  a bottom layer of said first conductivity type extending from said second region into said epitaxial layer.

12. The semiconductor structure as claimed in claim 11, further comprising a voltage termination of the second conductivity type extending from the electrode deeper into the epitaxial layer than the first region.

13. The semiconductor structure as claimed in claim 11, further comprising a sinker structure of said first conductivity type extending from said source region to the bottom of said epitaxial layer.

14. The semiconductor structure as claimed in claim 13, wherein said substrate is heavily doped.

15. The semiconductor structure as claimed in claim 11, wherein said second region has an approximate horizontal length of 1–3 microns.

16. The semiconductor structure as claimed in claim 11, wherein the first conductivity type is a p-type and the second conductivity type is an n-type.

17. The semiconductor structure as claimed in claim 11, wherein the first conductivity type is a n-type and the second conductivity type is an p-type.

18. A semiconductor transistor structure comprising:
a substrate having an epitaxial layer of a first conductivity type;
a source region extending from the surface of the epitaxial layer of a second conductivity type;
a drain region within said epitaxial layer of a second conductivity type;
a channel located between said drain and source regions;
a gate arranged above said channel;
wherein said drain region comprises:
  a first region of said second conductivity type for establishing a contact with an electrode;
  a second region of said second conductivity type being less doped than said first region being at least partially buried within said epitaxial layer and extending from said first region horizontally until under said gate;
  a top layer of said first conductivity type extending from the surface of said epitaxial layer to said second region; and
  a bottom layer of said first conductivity type extending from said second region into said epitaxial layer.

19. The semiconductor structure as claimed in claim 18, further comprising a voltage termination of the second conductivity type located on the side of said drain region opposite the side facing said gate and extending from the surface of said epitaxial layer.

20. The semiconductor structure as claimed in claim 18, further comprising a sinker structure of said first conductivity type extending from said source region to the bottom of said epitaxial layer.

21. The semiconductor structure as claimed in claim 20, wherein said substrate is heavily doped.

22. The semiconductor structure as claimed in claim 18, wherein said second region has an approximate horizontal length of 1–3 microns.

23. The semiconductor structure as claimed in claim 18, wherein the first conductivity type is a p-type and the second conductivity type is an n-type.

24. The semiconductor structure as claimed in claim 18, wherein the first conductivity type is a n-type and the second conductivity type is an p-type.

25. A semiconductor transistor structure comprising:
   a substrate having an epitaxial layer of a first conductivity type;
   a source region extending from the surface of the epitaxial layer of a second conductivity type;
   a drain region within said epitaxial layer of a second conductivity type;
   a channel located between said drain and source regions;
   a gate arranged above said channel;
   wherein said drain region comprises:
      a first region of said second conductivity type for establishing a contact with an electrode;
      a second region of said second conductivity type being less doped than said first region being buried within said epitaxial layer and extending from said first region horizontally in direction towards said gate;
      a third region of said second conductivity type being less doped than that second region and extending from said second region horizontally towards said gate;
      a fourth region of said second conductivity type extending vertically from the surface of said epitaxial layer and horizontally from said third region until under said gate, wherein said third region and said fourth region overlap and said overlap is higher doped than said fourth region;
      a top layer of said first conductivity type extending from the surface of said epitaxial layer to said second region; and
      a bottom layer of said first conductivity type extending from said second region into said epitaxial layer.

26. The semiconductor structure as claimed in claim 25, further comprising a voltage termination of the second conductivity type extending from the electrode deeper into the epitaxial layer than the first region.

27. The semiconductor structure as claimed in claim 25, further comprising a sinker structure of said first conductivity type extending from said source region to the bottom of said epitaxial layer.

28. The semiconductor structure as claimed in claim 27, wherein said substrate is heavily doped.

29. The semiconductor structure as claimed in claim 25, wherein said second region has an approximate horizontal length of 1–3 microns.

30. The semiconductor structure as claimed in claim 25, wherein the first conductivity type is a p-type and the second conductivity type is an n-type.

31. The semiconductor structure as claimed in claim 25, wherein the first conductivity type is a n-type and the second conductivity type is an p-type.

32. The semiconductor structure as claimed in claim 25, wherein said third region is partially less doped than said fourth region.

* * * * *

UNITED STATES PATENT AND TRADEMARK OFFICE
CERTIFICATE OF CORRECTION

PATENT NO. : 6,989,567 B2
APPLICATION NO. : 10/678837
DATED : January 24, 2006
INVENTOR(S) : Olof Tornblad et al.

It is certified that error appears in the above-identified patent and that said Letters Patent is hereby corrected as shown below:

Column 1, line 36: by deleting "$n^{30}$" and replacing with --$n^+$--.

Column 1, line 39: by deleting "$p^{30}$" and replacing with --$p^+$--.

Column 1, line 55: by deleting "$n^{30}$" and replacing with --$n^+$--.

Column 1, line 57: by deleting "$n^{30}$" and replacing with --$n^+$--.

Column 1, line 62: by deleting "tap" and replacing with --top--.

Signed and Sealed this

Twenty-seventh Day of May, 2008

JON W. DUDAS
*Director of the United States Patent and Trademark Office*